US007513590B2

(12) United States Patent
Saruta et al.

(10) Patent No.: US 7,513,590 B2
(45) **Date of Patent: *Apr. 7, 2009**

(54) METHOD OF NORMALITY DECISION WITH REGARD TO INK CARTRIDGE AND PRINTER ACTUALIZING THE METHOD

(75) Inventors: Toshihisa Saruta, Nagano-ken (JP); Tatsuya Seshimo, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 254 days.

This patent is subject to a terminal disclaimer.

(21) Appl. No.: 11/194,567

(22) Filed: Aug. 2, 2005

(65) Prior Publication Data

US 2005/0264625 A1 Dec. 1, 2005

Related U.S. Application Data

(62) Division of application No. 09/442,646, filed on Nov. 18, 1999, now Pat. No. 6,995,861.

(30) Foreign Application Priority Data

| | | | |
|---|---|---|---|
| Nov. 26, 1998 | (JP) | ................................ | 10-336330 |
| Nov. 26, 1998 | (JP) | ................................ | 10-336331 |
| Feb. 15, 1999 | (JP) | ................................ | 11-036117 |
| Oct. 18, 1999 | (JP) | ................................ | 11-296023 |

(51) Int. Cl.

| | |
|---|---|
| ***B41J 29/393*** | (2006.01) |
| ***B41J 2/175*** | (2006.01) |
| ***G11C 29/04*** | (2006.01) |
| *B41J 29/38* | (2006.01) |

(52) U.S. Cl. .............................. 347/19; 347/5; 347/86; 714/763

(58) Field of Classification Search .................... 347/19
See application file for complete search history.

(56) References Cited

U.S. PATENT DOCUMENTS 4,961,088 A 10/1990 Gilliland et al.
5,049,898 A 9/1991 Arthur et al.
5,138,344 A 8/1992 Ujita
5,289,210 A * 2/1994 Takayanagi .................. 347/19

(Continued)

FOREIGN PATENT DOCUMENTS

CN 1067981 A 1/1993
CN 1189415 A 8/1998

(Continued)

OTHER PUBLICATIONS

Patent Abstracts of Japan, vol. 1997, No. 03, Mar. 31, 1997, JP 08 310007, Nov. 26, 1996.
Patent Abstracts of Japan, vol. 017, No. 623 (M-1511), Nov. 17, 1993, JP 05 193127, Aug. 3, 1993.
Extended European Search Report in European patent appln. No. 06025077.6 (Feb. 11, 2008).

*Primary Examiner*—Matthew Luu
*Assistant Examiner*—Shelby Fidler
(74) *Attorney, Agent, or Firm*—Stroock & Stroock & Lavan LLP

(57) ABSTRACT

An ink cartridge of the present invention has a storage element, in which plural pieces of specific information relating to an ink cartridge are stored at specific addresses having predetermined data lengths. For example, a piece of information on the year of manufacture is registered in a data length of 7 bits, a piece of information on the month of manufacture is registered in a data length of 4 bits, and a piece of information on the date of manufacture is registered in a data length of 5 bits. A piece of information on the time (hour) of manufacture is registered in a data length of 5 bits, and a piece of information on the time (minute) of manufacture is registered in a data length of 6 bits. The technique of the present invention determines whether the storage element incorporated in the ink cartridge is normal or abnormal, based on the piece of information on the month of manufacture. This arrangement ensures the easy and adequate determination of whether or not the information stored in the storage element is destroyed.

8 Claims, 16 Drawing Sheets

U.S. PATENT DOCUMENTS

| | | | | |
|---|---|---|---|---|
| 5,365,312 | A | 11/1994 | Hillmann et al. | |
| 5,410,641 | A | 4/1995 | Wakabayashi et al. | |
| 5,610,635 | A | 3/1997 | Murray et al. | |
| 5,610,873 | A | 3/1997 | Lee | |
| 5,646,660 | A | 7/1997 | Murray | |
| 5,699,091 | A | 12/1997 | Bullock et al. | |
| 5,786,828 | A | 7/1998 | Yamamoto | |
| 5,788,388 | A | 8/1998 | Cowger et al. | |
| 5,812,156 | A | 9/1998 | Bullock et al. | |
| 5,822,076 | A | 10/1998 | Maruyama | |
| 5,835,817 | A | 11/1998 | Bullock et al. | |
| 5,861,897 | A | 1/1999 | Ide et al. | |
| RE36,279 | E | 8/1999 | Ujita | |
| 5,975,677 | A | 11/1999 | Marler et al. | |
| 5,995,774 | A | 11/1999 | Applegate et al. | |
| 6,019,461 | A | 2/2000 | Yoshimura et al. | |
| 6,109,723 | A | 8/2000 | Castle et al. | |
| 6,126,265 | A | 10/2000 | Childers et al. | |
| 6,168,262 | B1 | 1/2001 | Clark et al. | |
| 6,181,885 | B1 * | 1/2001 | Best et al. | 399/13 |
| 6,196,670 | B1 | 3/2001 | Saruta | |
| 6,227,643 | B1 | 5/2001 | Purcell et al. | |
| 6,271,928 | B1 * | 8/2001 | Bullock et al. | 358/1.16 |
| 6,362,868 | B1 * | 3/2002 | Silverbrook | 347/86 |
| 6,375,298 | B2 | 4/2002 | Purcell et al. | |
| 6,421,137 | B1 * | 7/2002 | Endo | 358/1.16 |
| 6,447,090 | B1 | 9/2002 | Saruta | 347/19 |
| 6,556,792 | B2 * | 4/2003 | Yoshimura | 399/13 |
| 6,565,181 | B2 | 5/2003 | Silverbrook | |
| 6,565,198 | B2 | 5/2003 | Saruta et al. | 347/86 |
| 6,616,260 | B2 * | 9/2003 | Skene et al. | 347/19 |
| 6,791,732 | B2 * | 9/2004 | Simon | 359/237 |
| 6,955,411 | B2 | 10/2005 | Saruta | 347/19 |
| 6,995,861 | B1 * | 2/2006 | Saruta et al. | 358/1.9 |
| 7,195,346 | B1 * | 3/2007 | Saruta et al. | 347/86 |
| 2005/0174372 | A1 | 8/2005 | Saruta et al. | 347/7 |
| 2005/0264625 | A1 | 12/2005 | Saruta et al. | |
| 2005/0280679 | A1 | 12/2005 | Saruta | 347/86 |

FOREIGN PATENT DOCUMENTS

| | | | | |
|---|---|---|---|---|
| EP | 0 688 673 | | | 12/1995 |
| EP | 789 322 | A2 | | 8/1997 |
| EP | 0 878 307 | A2 | | 11/1998 |
| EP | 0 878 307 | A3 | | 11/1998 |
| GB | 2 257 274 | A | | 1/1993 |
| JP | 62-184856 | | | 8/1987 |
| JP | 2-279344 | | | 11/1990 |
| JP | 4-500482 | | | 1/1992 |
| JP | 8-177608 | | | 7/1996 |
| JP | 8-187854 | | | 7/1996 |
| JP | 8-197748 | | | 8/1996 |
| JP | 8-224885 | | | 9/1996 |
| JP | 2594912 | | | 12/1996 |
| JP | 9-1823 | | | 1/1997 |
| JP | 9-48120 | | | 2/1997 |
| JP | 9-269876 | | | 10/1997 |
| JP | 9-309213 | A | | 12/1997 |
| JP | 9-314861 | | | 12/1997 |
| JP | 10-217509 | | | 8/1998 |
| WO | WO 92/19046 | | * | 10/1992 |
| WO | WO98/043136 | | * | 10/1998 |

* cited by examiner

80K(81K)

| Items of Information | Address of Storage Element 80K | Capacity (bit) in Storage Element |
|---|---|---|
| Remaining quantity of black ink | 00 | 8 |
| Frequency of cleaning | 08 | 8 |
| Frequency of attachment | 10 | 8 |
| Total time period of attachment | 18 | 16 |
| Year of manufacture | 28 | 7 |
| Month of manufacture | 2F | 4 |
| Date of manufacture | 33 | 5 |
| Hour of manufacture | 38 | 5 |
| Minute of manufacture | 3D | 6 |
| Production serial No. | 43 | 8 |
| Frequency of recycle | 4B | 3 |
| Ink cartridge name | 4E | 10 |
| Ink type | 58 | 8 |
| Term of validity | 60 | 6 |
| Term of validity after unsealed | 66 | 5 |

Fig.11

| Items of Information | Address of Storage Element 80F | Capacity (bit) in Storage |
|---|---|---|
| Remaining quantity of cyan ink | 00 | 8 |
| Remaining quantity of magenta ink | 08 | 8 |
| Remaining quantity of yellow ink | 10 | 8 |
| Remaining quantity of light cyan ink | 18 | 8 |
| Remaining quantity of light magenta ink | 20 | 8 |
| Frequency of cleaning | 28 | 8 |
| Frequency of attachment | 30 | 8 |
| Total time period of attachment | 38 | 16 |
| Year of manufacture | 48 | 7 |
| Month of manufacture | 4F | 4 |
| Date of manufacture | 53 | 5 |
| Hour of manufacture | 58 | 5 |
| Minute of manufacture | 5D | 6 |
| Production serial No. | 63 | 8 |
| Frequency of recycle | 6B | 3 |
| Ink cartridge name | 6E | 10 |
| Ink type | 78 | 8 |
| Term of validity | 80 | 6 |
| Term of validity after unsealed | 86 | 5 |

80F(81F)

Fig. 12

METHOD OF NORMALITY DECISION WITH REGARD TO INK CARTRIDGE AND PRINTER ACTUALIZING THE METHOD

BACKGROUND OF THE INVENTION

1. Field of the Invention

The present invention relates to a method of normality decision with regard to an ink cartridge, which is detachably attached to a printing apparatus like an ink jet printer or an ink jet plotter, as well as to a printer that actualizes the method.

2. Description of the Related Art

The type of ink usable for a printer generally depends upon the type of the printer, such as the ink jet printer or the dot impact printer. Byway of example, it is assumed that a certain type of ink is usable for a specific printer. If another type of ink, which has different properties from those of the certain type of ink and is not generally used for the specific printer, is mistakenly attached to the specific printer, a desired printing result may not be obtained. In another example, the ink jet printer may encounter the troubles due to a difference in viscosity of ink, such as a poor printing result or clogging nozzles on a print head.

A proposed technique to solve this problem utilizes a first storage unit incorporated in an ink cartridge, in which identification data representing a type of the ink cartridge is stored, and a second storage unit incorporated in a printer main body, in which comparative data for the purpose of comparison are stored. The technique compares the identification data with the comparative data and determines whether both the data are coincident with each other. The printing process continues in the case where both the data are coincident with each other. When both the data are not coincident, on the contrary, the inconsistency is informed and the printing process is discontinued.

The identification data stored in the first storage unit of the ink cartridge may, however, be destroyed by the static electricity or another cause. An oxide layer formed at a contact between the storage unit in the printer main body and the ink cartridge or at a contact between the storage unit in the ink cartridge and the printer main body may cause a failure of electrical contact. In such cases, there is a fear of determining that the ink cartridge is abnormal or unsuitable, while the ink cartridge itself is actually normal and suitable.

SUMMARY OF THE INVENTION

The object of the present invention is thus to provide a method of readily and adequately determining whether or not information stored in a storage unit, which is included in an ink cartridge detachably attached to a printer, as well as to provide a printer actualizing the method.

At least part of the above and the other related objects is attained by a method of determining whether or not a storage unit included in an ink cartridge is normal, wherein the ink cartridge is detachably attached to a printer. The method includes the steps of: (a) reading a piece of decision information, which has been registered in advance in a predetermined format, from the storage unit; and (b) identifying whether or not the read-out piece of decision information satisfies the predetermined format, so as to determine whether or not the storage unit is normal.

The method of the present invention determines whether or not the storage unit is normal or abnormal, based on the piece of decision information. This arrangement ensures the easy and adequate determination of whether or not the information stored in the storage unit is destroyed.

In accordance with one preferable application of the present invention, the step (b) determines that the storage unit is not normal in the case where the read-out piece of decision information does not satisfy the predetermined format. In accordance with another application of the present invention, the step (b) uses a piece of information relating to a month of manufacture of the ink cartridge as the piece of decision information. In this configuration, the piece of information relating to the month of manufacture of the ink cartridge may be expressed by a data length of four bits, and the step (b) may determine that the storage unit is not normal in the case where all the four-bits have an identical digit, that is, either one of ‘0’ and ‘1’.

This arrangement further facilitates the adequate determination of whether or not the information stored in the storage unit is destroyed.

It is preferable that the method further includes either the step of (c) providing a display representing that the storage unit is not normal, when the step (b) determines that the storage unit is not normal or the step of (d) discontinuing a printing operation of the printer, when the step (b) determines that the storage unit is not normal. It is also preferable that the method further includes the step of (e) causing the printer to perform a printing operation, when the step (b) determines that the storage unit is normal since the read-out piece of decision information satisfies the predetermined format.

The present invention is also directed to a printer, to which an ink cartridge having a storage unit is detachably attached. The printer includes: a reading unit that reads a piece of decision information, which has been registered in advance in a predetermined format, from the storage unit; and a decision unit that identifies whether or not the read-out piece of decision information satisfies the predetermined format, so as to determine whether or not the storage unit is normal.

In the printer of the present invention, the decision unit determines whether the storage unit is normal or abnormal, based on the piece of decision information. This arrangement ensures the easy and adequate determination of whether or not the information stored in the storage unit is destroyed.

In accordance with one preferable application of the present invention, the decision unit determines that the storage unit is not normal in the case where the read-out piece of decision information does not satisfy the predetermined format. In accordance with another preferable application of the present invention, the decision unit determines that the storage unit is normal in the case where the read-out piece of decision information satisfies the predetermined format. The piece of decision information may be a piece of information relating to a month of manufacture of the ink cartridge. In this case, it is preferable that the piece of information relating to the month of manufacture of the ink cartridge is expressed by a data length of four bits, and that the decision unit determines that the storage unit is not normal in the case where all the four bits have an identical digit, that is, either one of ‘0’ and ‘1’.

This arrangement further facilitates the adequate determination of whether or not the information stored in the storage unit is destroyed.

It is preferable that the printer further includes a display unit that provides a display representing that the storage unit is not normal, when the decision unit determines that the storage unit is not normal. It is also preferable that the printer further includes a printing operation stop unit that discontinues a printing operation of the printer, when the decision unit determines that the storage unit is not normal.

The present invention is further directed to a storage unit included in an ink cartridge, which is detachably attached to a printer. The storage unit includes: an address counter that outputs a count in response to a clock signal output from the printer; and a storage element that stores plural pieces of specific information including a piece of decision information registered in a predetermined format and that is sequentially accessed based on the count output from the address counter.

The storage unit of the present invention readily and adequately determines whether or not the information stored in the storage unit is destroyed, using the piece of decision information registered in a predetermined format.

The present invention is also directed to a computer readable recording medium, on which a specific computer program is recorded. The specific computer program is used to determine whether or not a storage unit is normal, wherein the storage unit is included in an ink cartridge, which is detachably attached to a printer. The specific computer program includes: a program code that causes a computer to read a piece of decision information, which has been registered in advance in a predetermined format, from the storage unit; a program code that causes the computer to identify whether or not the read-out piece of decision information satisfies the predetermined format; and a program code that causes the computer to determine that the storage unit is not normal in the case where the read-out piece of decision information does not satisfy the predetermined format.

In the computer readable recording medium of the present invention, the specific computer program recorded thereon is used to determine whether the storage unit is normal or abnormal, based on the piece of decision information registered in a predetermined format. This arrangement ensures the easy and adequate determination of whether or not the information stored in the storage unit is destroyed.

The present invention is further directed to a method of determining whether or not a readable and writable storage unit is normal, wherein the readable and writable storage unit is included in an ink cartridge, which is detachably attached to a printer. The method includes the steps of: reading a piece of decision information from the storage unit; and determining whether or not the storage unit is normal, based on the read-out piece of decision information.

The method of the present invention determines whether the readable and writable storage unit is normal or abnormal, based on the piece of decision information. This arrangement ensures the easy and adequate determination of whether or not the information stored in the readable and writable storage unit is destroyed.

These and other objects, features, aspects, and advantages of the present invention will become more apparent from the following detailed description of the preferred embodiment with the accompanying drawings.

BRIEF DESCRIPTION OF THE DRAWINGS

FIG. 11 shows the internal data structure of a memory cell in the storage element of the black ink cartridge;

FIG. 12 shows the internal data structure of a memory cell in the storage element of the color ink cartridge;

DESCRIPTION OF THE PREFERRED EMBODIMENTS

First Embodiment (General Structure of Ink Jet-Type Printing Apparatus)

Figure 1:
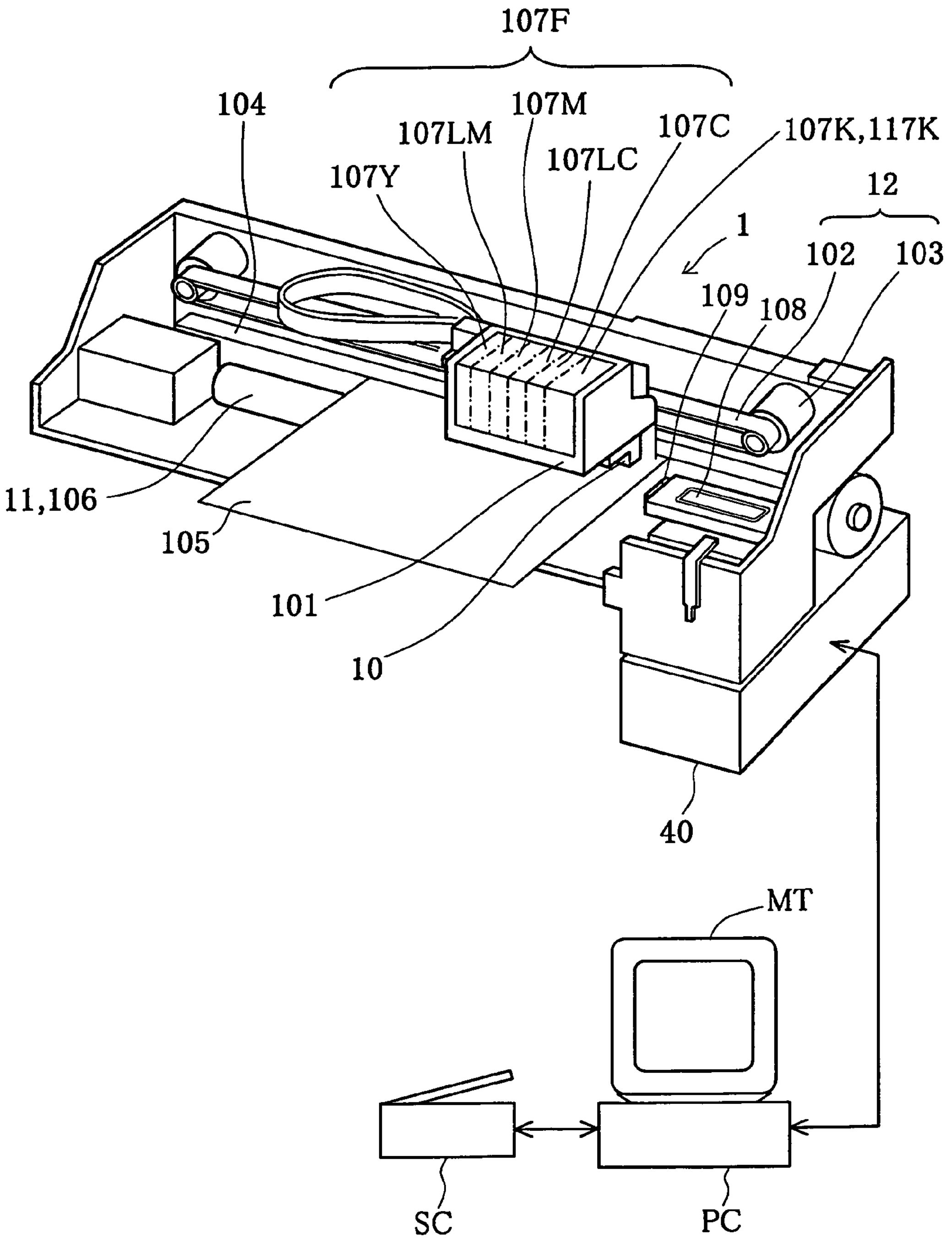
FIG. 1 is a perspective view illustrating the structure of a main part of an ink jet printer in one embodiment according to the present invention.

FIG. 1 is a perspective view illustrating the structure of a main part of an ink jet printer 1 in one embodiment according to the present invention. The ink jet printer 1 of the embodiment is used in connection with a computer PC, to which a scanner SC is also connected. The computer PC reads and executes an operating system and predetermined programs to function, in combination with the ink jet printer 1, as an ink jet-type printing apparatus. The computer PC executes an application program on a specific operating system, carries out processing of an input image, for example, read from the scanner SC, and displays a processed image on a CRT display MT. When the user gives a printing instruction after the required image processing, for example, retouching the image on the CRT display MT, is concluded, a printer driver incorporated in the operating system is activated to transfer processed image data to the ink jet printer 1.

The printer driver converts original color image data, which are input from the scanner SC and subjected to the required image processing, to color image data printable by the ink jet printer 1 in response to the printing instruction, and outputs the converted color image data to the ink jet printer 1. The original color image data consists of three color components, that is, red (R), green (G), and blue (B). The converted color image data printable by and output to the ink jet printer 1 consists of six color components, that is, black (K), cyan (C), light cyan (LC), magenta (M), light magenta (LA), and yellow (Y). The printable color image data are further subjected to binary processing, which specifies the on-off state of ink dots. These image processing and data conversion processes are known in the art and are thus not specifically described here. These processes may be carried out in the ink jet printer 1, in place of the printer driver included in the computer PC.

In the ink jet printer 1, a carriage 101 is connected to a carriage motor 103 in a carriage mechanism 12 via a timing belt 102, and is guided by a guide member 104 to move forward and backward along a width of a sheet of printing paper (printing medium) 105. The ink jet printer 1 also has a sheet feed mechanism 11 with a sheet feed roller 106. An ink jet-type print head 10 is attached to a specific face of the carriage 101 that faces the printing paper 105, that is, a lower face in this embodiment. The print head 10 receives supplies of inks fed from ink cartridges 107K and 107F mounted on the carriage 101, and ejects ink droplets onto the printing paper 105 with a movement of the carriage 101, so as to create dots and print an image or letters on the printing paper 105.

The ink cartridge 107K has an ink chamber 117K, in which black ink (K) is kept. The ink cartridge 107F has a plurality of ink chambers 107C, 107LC, 107M, 107LM, and 107Y, which are formed independently of one another. Cyan ink (C), light cyan ink (LC), magenta ink (M), light magenta ink (LM), and yellow ink (Y) are respectively kept in the ink chambers 107C, 107LC, 107M, 107LM, and 107Y. The print head 10 receives the respective supplies of color inks fed from these ink chambers 107C, 107LC, 107M, 107LM, and 107Y. The print head 10 ejects these color inks in the form of ink droplets of the respective colors, so as to implement color printing.

A capping unit 108 is disposed in a non-printable area (non-storage area) of the ink jet printer 1 to close nozzle openings of the print head 10 while the printing operation is not carried out. The capping unit 108 effectively prevents an increase in viscosity of ink and formation of an ink film due to vaporization of a solvent component from the ink while the printing operation is not performed. The capping unit 108 also collects ink droplets from the print head 10 occurring by a flushing process during the execution of the printing operation. A wiping unit 109 is disposed near the capping unit 108 to wipe the surface of the print head 10, for example, with a blade, so as to wipe out the ink residue or paper dust adhering to the surface of the print head 10.

Figure 2:
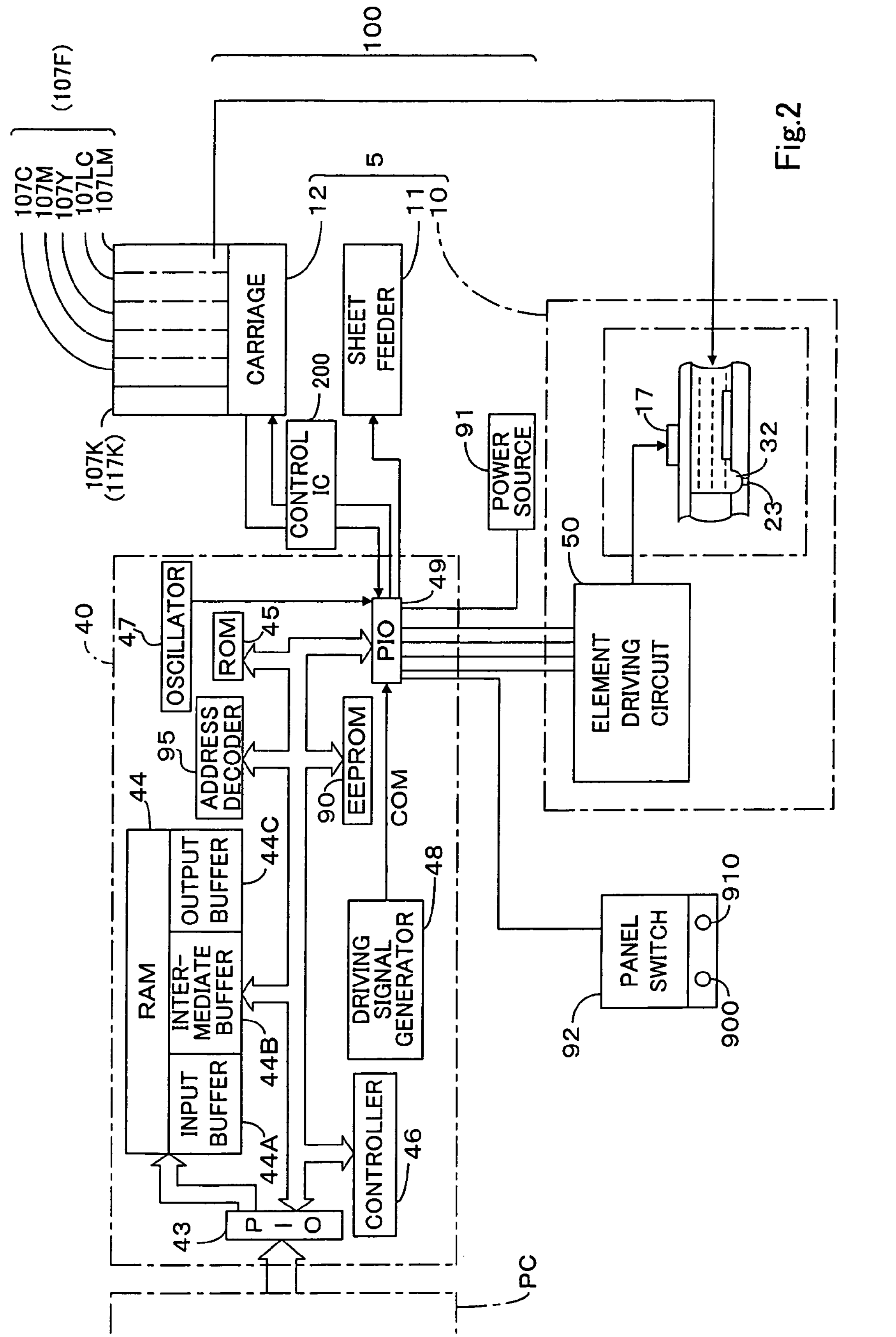
FIG. 2 is a functional block diagram of the ink jet printer shown in FIG. 1.

FIG. 2 is a functional block diagram of the ink jet printer 1 of the embodiment. The ink jet printer 1 includes a printer main body 100 (main body of the printing apparatus) including a print controller 40 and a print engine 5. The print controller 40 has an interface 43 that receives print data including multi-tone information transmitted from a computer PC, a RAM 44 in which a variety of data, for example, the print data including the multi-tone information, are stored, and a ROM 45 in which routines for various data processing are stored. The print controller 40 further has a controller 46 including a CPU, an oscillator circuit 47, a driving signal generator circuit 48 that generates a driving signal COM given to the print head 10, and a parallel input-output interface 49 that transmits the print data developed to dot pattern data and the driving signal COM to the print engine 5.

Control lines of a panel switch 92 and a power source 91 are also connected to the print controller 40 via the parallel input-output interface 49. The panel switch 92 has a black ink end LED 900 and a color ink end LED 910. Each of the LEDs 900 and 910 lights up to draw the attention of the user at the time of running out of ink. When a power-off instruction is input from the panel switch 92, the print controller 40 outputs a power down instruction (NMI) to the power source 91, which then falls into a stand-by state. The power source 91 in the stand-by state supplies a stand-by electric power to the print controller 40 via a power line (not shown). Namely the standard power OFF process carried out via the panel switch 92 does not completely cut of f the supply of electric power to the print controller 40.

The print controller 40 monitors whether a preset electric power is supplied from the power source 91. The print controller 40 also outputs the power down instruction (NMI) when a power plug is pulled out of a socket. The power source 91 has an auxiliary power unit (for example, a capacitor), in order to ensure a supply of electric power for a predetermined time period (for example, 0.3 sec) after the power plug is pulled out of the socket.

The print controller 40 further includes an EEPROM 90 that stores information regarding the black ink cartridge 107K and the color ink cartridge 107F mounted on the carriage 101 (see FIG. 1). Specific pieces of information including the pieces of information regarding quantities of inks in the black ink cartridge 107K and the color ink cartridge 107F (remaining quantities of inks or amounts of ink consumption) are stored in the EEPROM 90. The details of such information will be discussed later. The print controller 40 also has an address decoder 95 that converts an address in memory cells 81K and 81F (described later) of storage elements 80K and 80F (described later), to which the controller 46 requires an access (read/write), into a number of clocks.

(Arrangement of Control IC 200)

Figure 3:
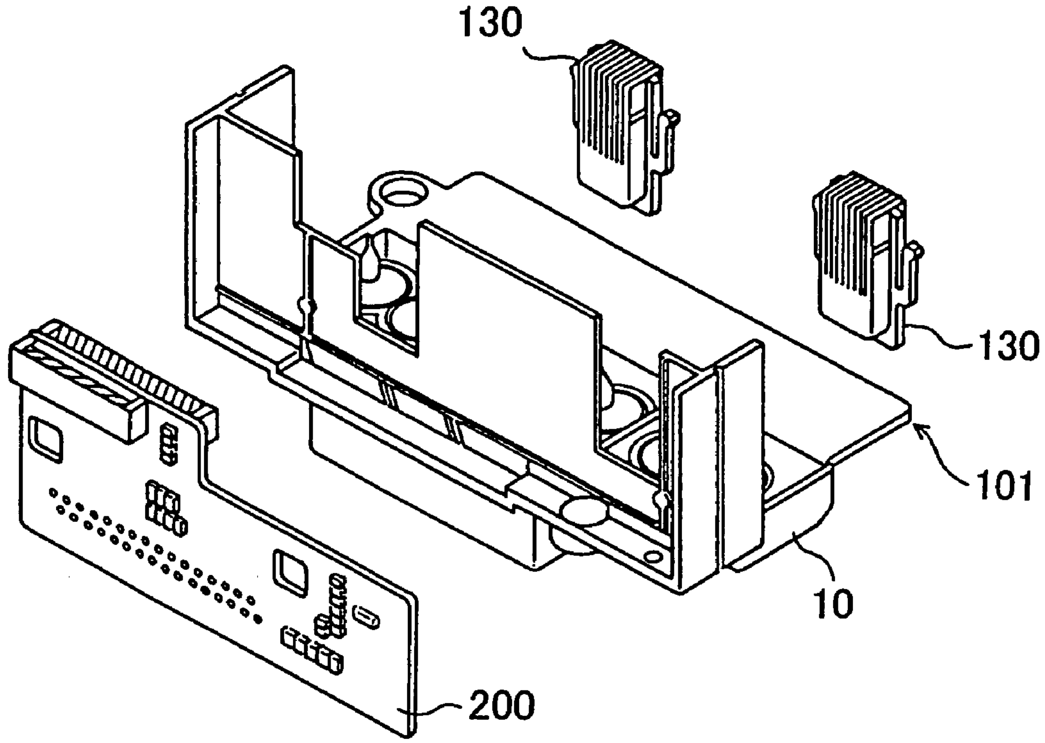
FIG. 3 is a decomposed perspective view illustrating the structure of a carriage used in the ink jet printer of the embodiment.
Figure 4:
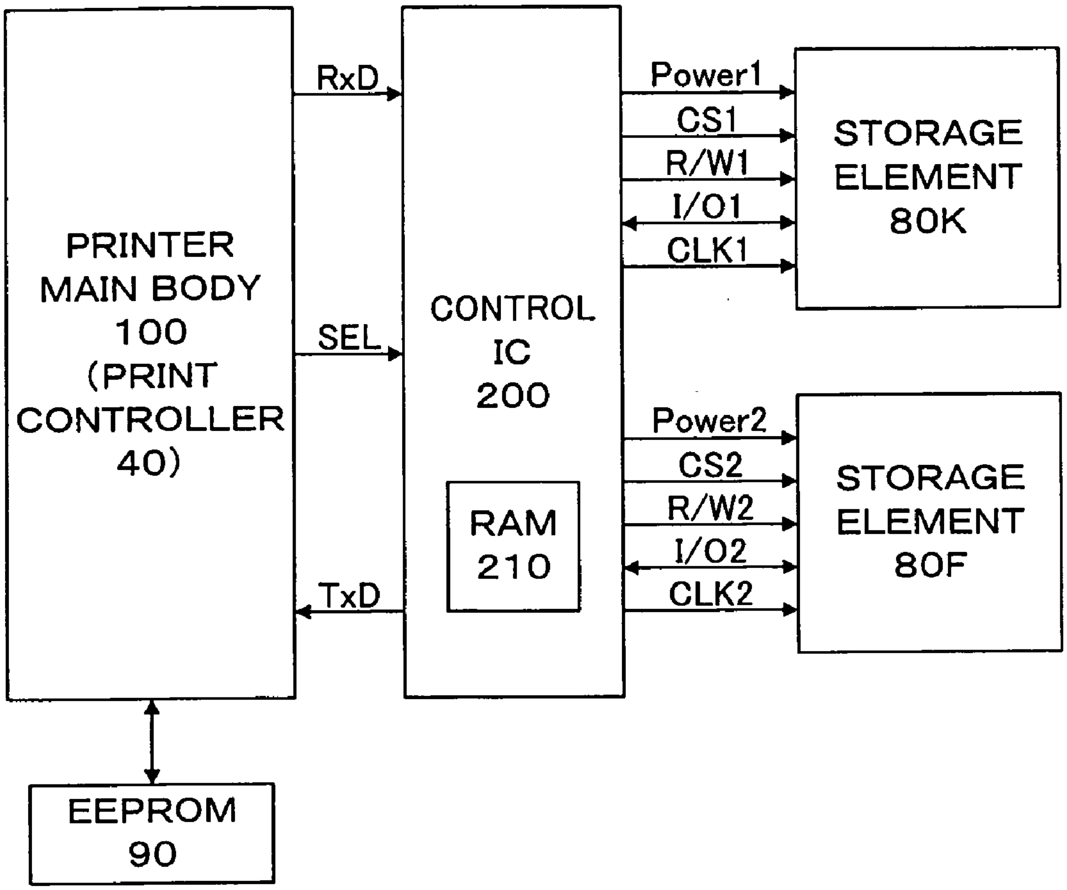
FIG. 4 schematically illustrates a connection between a printer main body, a control IC, and storage elements.

The print controller 40 is connected to a control IC 200, which controls read and write operations from and to the respective ink cartridges 107K and 107F (storage elements 80K and 80F). The details of the control IC 200 are described with reference to FIGS. 3 and 4. FIG. 3 is a decomposed perspective view illustrating the structure of the carriage 101 in the ink jet printer of the embodiment. FIG. 4 schematically illustrates a connection between the printer main body 100, the control IC 200, and the storage elements 80K and 80F.

Referring to FIG. 3, the control IC 200 is provided on and integrated with the print head 10. The control IC 200 comes into contact with the respective storage elements 80K and 80F mounted on the ink cartridges 107K and 107F via contact mechanisms 130 disposed on the carriage 101, and controls the writing operations of specific information according to the requirements. As shown in FIGS. 2 and 4, the control IC 200 has a RAM 210, in which data are temporarily kept, and is connected to the print controller 40 via the parallel input-output interface 49 and further to the storage elements 80K and 80F. The control IC 200 is namely interposed between the print controller 40 and the respective storage elements 80K and 80F mounted on the ink cartridges 107K and 107F and controls the data transmission between the print controller 40 and the storage elements 80K and 80F. For convenience of illustration, the print head 10, the carriage mechanism 12, and the control IC 200 are shown separately in FIG. 2.

The print controller 40 outputs an input signal RxD and a command selection signal SEL and carries out the writing operation of specific information into the control IC 200 at preset time intervals. The specific information are temporarily kept in the RAM 210. The preset time interval here represents every time the printing operation with regard to one page is completed, every time the printing operation with regard to several raster lines is completed, or every time the manual cleaning process is carried out. The specific information includes, for example, pieces of information regarding the remaining quantities of inks, the frequency of cleaning, the frequency of attachment of the ink cartridge, and the total time of attachment. The control IC 200 receives the input signal RxD and the command selection signal SEL and outputs a desired piece of information required by the print controller 40 among pieces of information, which are previously read from the respective storage elements 80K and 80F and stored in the control IC 200, as an output signal TxD to the print controller 40.

(Other Characteristics of Printer 1)

In the ink jet printer 1 of the embodiment, the quantity of ink ejection is calculated by multiplying the weight of ink droplets ejected from a plurality of nozzle openings 23 by the frequency of ejection of the ink droplets. The current remaining quantity of ink is determined by subtracting an amount of ink consumption from the previous remaining quantity of ink before the start of the current printing operation. The amount of ink consumption is the sum of the calculated quantity of ink ejection and a quantity of ink suction. The ink suction is carried out, for example, when some abnormality occurs due to bubbles invading the print head 10. The procedure of ink suction causes the capping unit 108 to be pressed against the print head 10 and thereby close the nozzle openings 23, and sucks ink by means of a pump mechanism (not shown) linked with the capping unit 108 for the purpose of restoration. The controller 46 performs the calculation of the remaining quantity of ink from the data stored in the EEPROM 90 according to a program stored in advance in the ROM 45.

The ink jet printer 1 of the embodiment receives the binary data as described previously. The array of the binary data is, however, not coincident with the nozzle array on the print head 10. The control unit 46 accordingly divides the RAM 44 into three portions, that is, an input buffer 44A, an intermediate buffer 44B, and an output buffer 44C, in order to perform the rearrangement of the dot data array. The ink jet printer 1 may alternatively carry out the required processing for the color conversion and the binarization. In this case, the ink jet printer 1 registers the print data, which include the multi-tone information and are transmitted from the computer PC, into the input buffer 44A via the interface 43. The print data kept in the input buffer 44A are subjected to command analysis and then transmitted to the intermediate buffer 44B. The controller 46 converts the input print data into intermediate codes by supplying information regarding the printing positions of the respective letters or characters, the type of modification, the size of the letters or characters, and the font address. The intermediate codes are kept in the intermediate buffer 44B. The controller 46 then analyzes the intermediate codes kept in the intermediate buffer 44B and decodes the intermediate codes into binary dot pattern data. The binary dot pattern data are expanded and stored in the output buffer 44C.

In any case, when dot pattern data corresponding to one scan of the print head 10 are obtained, the dot pattern data are serially transferred from the output buffer 44C to the print head 10 via the parallel input-output interface 49. After the dot pattern data corresponding to one scan of the print head 10 are output from the output buffer 44C, the process erases the contents of the intermediate buffer 44B to wait for conversion of a next set of print data.

The print engine 5 has the print head 10, the sheet feed mechanism 11, and the carriage mechanism 12. The sheet feed mechanism 11 successively feeds the printing medium, such as printing paper, to implement sub-scan, whereas the carriage mechanism 12 carries out main scan of the print head 10.

The print head 10 causes the respective nozzle openings 23 to eject ink droplets against the printing medium at a predetermined timing, so as to create an image corresponding to the generated dot pattern data on the printing medium. The driving signal COM generated in the driving signal generator circuit 48 is output to an element driving circuit 50 in the print head 10 via the parallel input-output interface 49. The print head 10 has a plurality of pressure chambers 32 and a plurality of piezoelectric vibrators 17 (pressure-generating elements) respectively connecting with the nozzle openings 23. The number of both the pressure chambers 32 and the piezoelectric vibrators 17 is thus coincident with the number of the nozzle openings 23. When the driving signal COM is sent from the element driving circuit 50 to a certain piezoelectric vibrator 17, the corresponding pressure chamber 32 is contracted to cause the corresponding nozzle opening 23 to eject an ink droplet.

Figure 5:
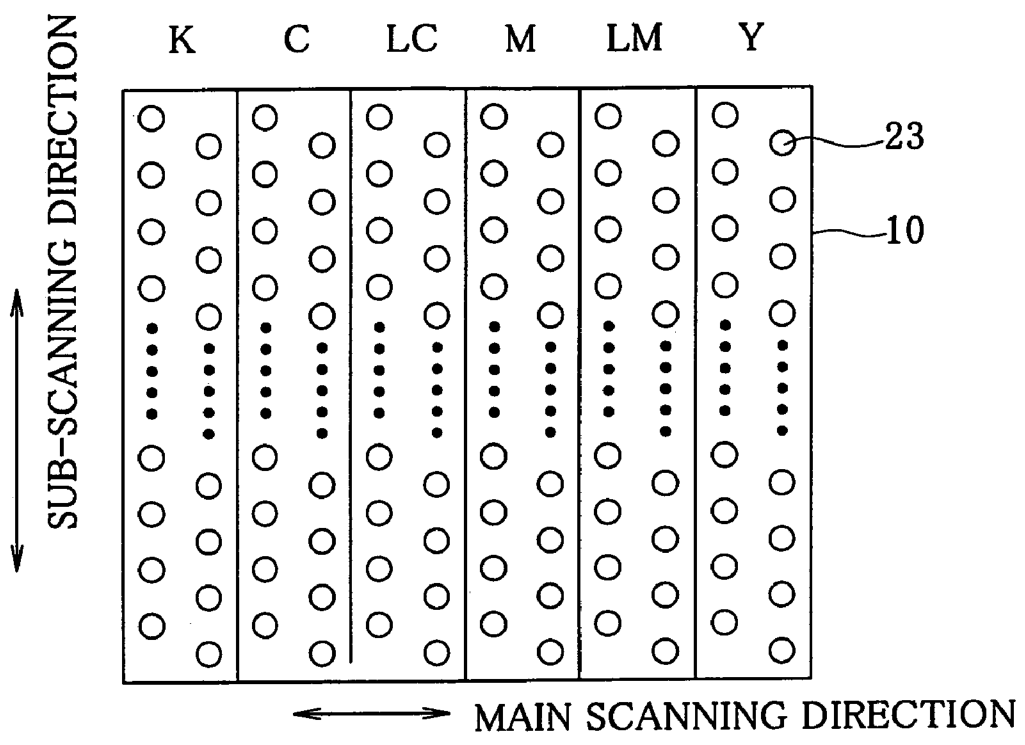
FIG. 5 shows a layout of nozzle openings formed on the print head shown in FIG. 1.

FIG. 5 shows a layout of the nozzle openings 23 formed on the print head 10. The nozzle openings 23 on the print head 10 are divided into six nozzle arrays of black (K), cyan (C), light cyan (LC), magenta (M), light magenta (LM), and yellow (Y).

(Structure of Ink Cartridge 107 and Cartridge Attachment Unit 18)

The black ink cartridge 107K and the color ink cartridge 107F, which are attached to the ink jet printer 1 having the above configuration, have a common basic structure. The following description regards the structure of the ink cartridges 107K and 107F, the black ink cartridge 107K as an example, and the structure of a cartridge attachment unit 18 of the printer main body 100, which receives and holds the ink cartridge, with reference to FIGS. 6A, 6B, and 7.

Figure 6A:
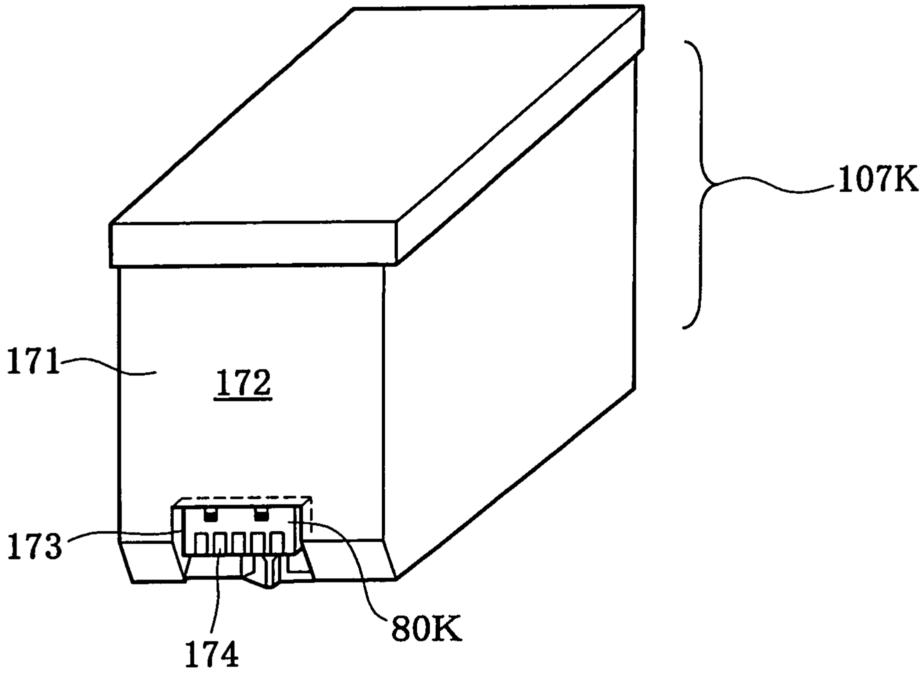
FIGS. 6A and 6B are perspective views schematically illustrating the structure of an ink cartridge and a cartridge attachment unit of the printer main body, respectively.
Figure 6B:
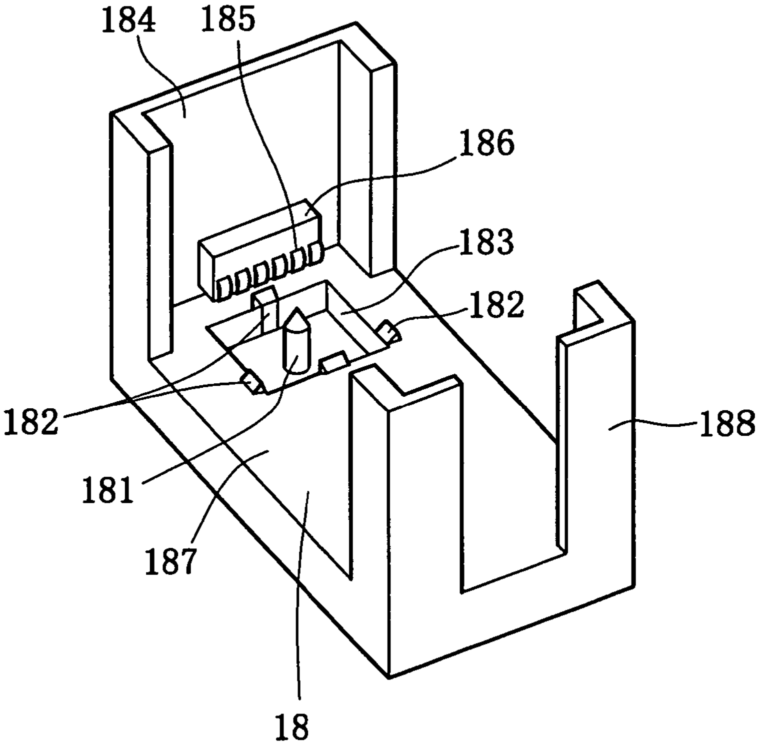
Figure 7:
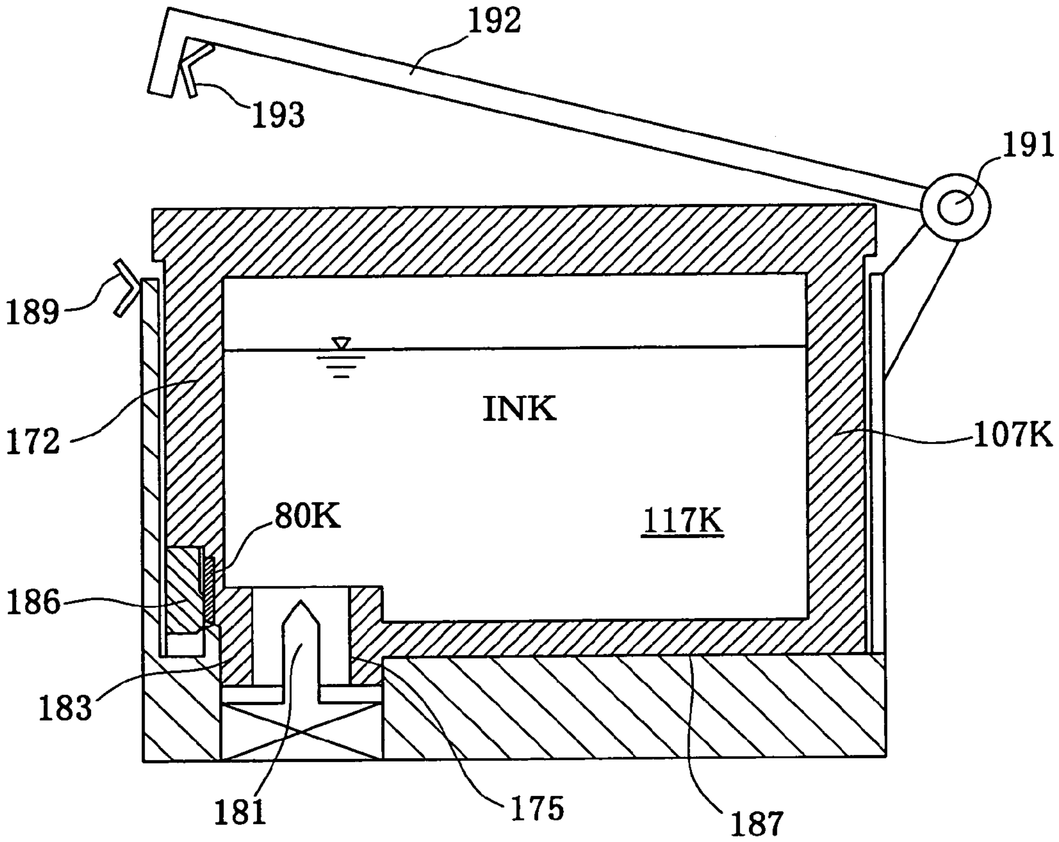
FIG. 7 is a sectional view illustrating an attachment state in which the ink cartridge shown in FIG. 6A is attached to the cartridge attachment unit shown in FIG. 6B.

FIGS. 6A and 6B are perspective views schematically illustrating the structure of the ink cartridge 107K and the cartridge attachment unit 18 of the printer main body 100, respectively. FIG. 7 is a sectional view illustrating an attachment state in which the ink cartridge 107K is attached to the cartridge attachment unit 18.

Referring to FIG. 6A, the ink cartridge 107K has a cartridge main body 171 that is composed of a synthetic resin and defines the ink chamber 117K in which black ink is kept, and a storage element 80K incorporated in a side frame 172 of the cartridge main body 171. The storage element 80K carries out transmission of various data to and from the printer main body 100, when the ink cartridge 107K is attached to the cartridge attachment unit 18 of the printer main body 100 shown in FIG. 6B. The storage element 80K is received in a bottom-opened recess 173 formed in the side frame 172 of the ink cartridge 107K. The storage element 80K has a plurality of connection terminals 174 exposed to the outside. Alternatively the whole storage element 80K may be exposed to the outside.

Referring to FIG. 6B, the cartridge attachment unit 18 has an ink supply needle 181, which is disposed upward on a bottom 187 of a cavity, in which the ink cartridge 107K is accommodated. A recess 183 is formed about the ink supply needle 181 to receive an ink supply unit 175 (see FIG. 7) formed in the ink cartridge 107K. Three cartridge guides 182 are set on the inner wall of the recess 183. A connector 186 is placed on an inner wall 184 of the cartridge attachment unit 18. The connector 186 has a plurality of electrodes 185, which electrically connect with the plurality of connection terminals 174 of the storage element 80K when the ink cartridge 107K is attached to the cartridge attachment unit 18.

The ink cartridge 107K is attached to the cartridge attachment unit 18 according to the following procedure. The procedure first places the ink cartridge 107K on the cartridge attachment unit 18. The procedure then presses down a lever 182, which is fixed to a rear wall 188 of the cartridge attachment unit 18 via a support shaft 191 as shown in FIG. 7, to be over the ink cartridge 107K. The press-down motion of the lever 182 presses the ink cartridge 107K downward, so as to make the ink supply unit 175 fitted into the recess 183 and make the ink supply needle 181 pierce the ink supply unit 175, thereby enabling a supply of ink. As the lever 192 is further pressed down, a clutch 193 disposed on a free end of the lever 192 engages with a mating element 189 disposed on the cartridge attachment unit 18. This fixes the ink cartridge 107K to the cartridge attachment unit 18. In this state, the plurality of connection terminals 174 on the storage element 80K in the ink cartridge 107K electrically connect with the plurality of electrodes 185 on the cartridge attachment unit 18. This enables transmission of data between the printer main body 100 and the storage element 80K via the control IC 200.

The color ink cartridge 107F basically has a similar structure to that of the ink cartridge 107K, and only the difference is described here. The color ink cartridge 107F has five ink chambers in which five different color inks are kept. It is required to feed the supplies of the respective color inks to the print head 10 via separate pathways. The color ink cartridge 107F accordingly has five ink supply units 175, which respectively correspond to the five different color inks. The color ink cartridge 107F, in which five different color inks are kept, however, has only one storage element 80F incorporated therein. Pieces of information regarding the ink cartridge 107F and the five different color inks are collectively stored in this storage element 80F.

(Operation of Ink Jet Printer 1)

Figure 8:
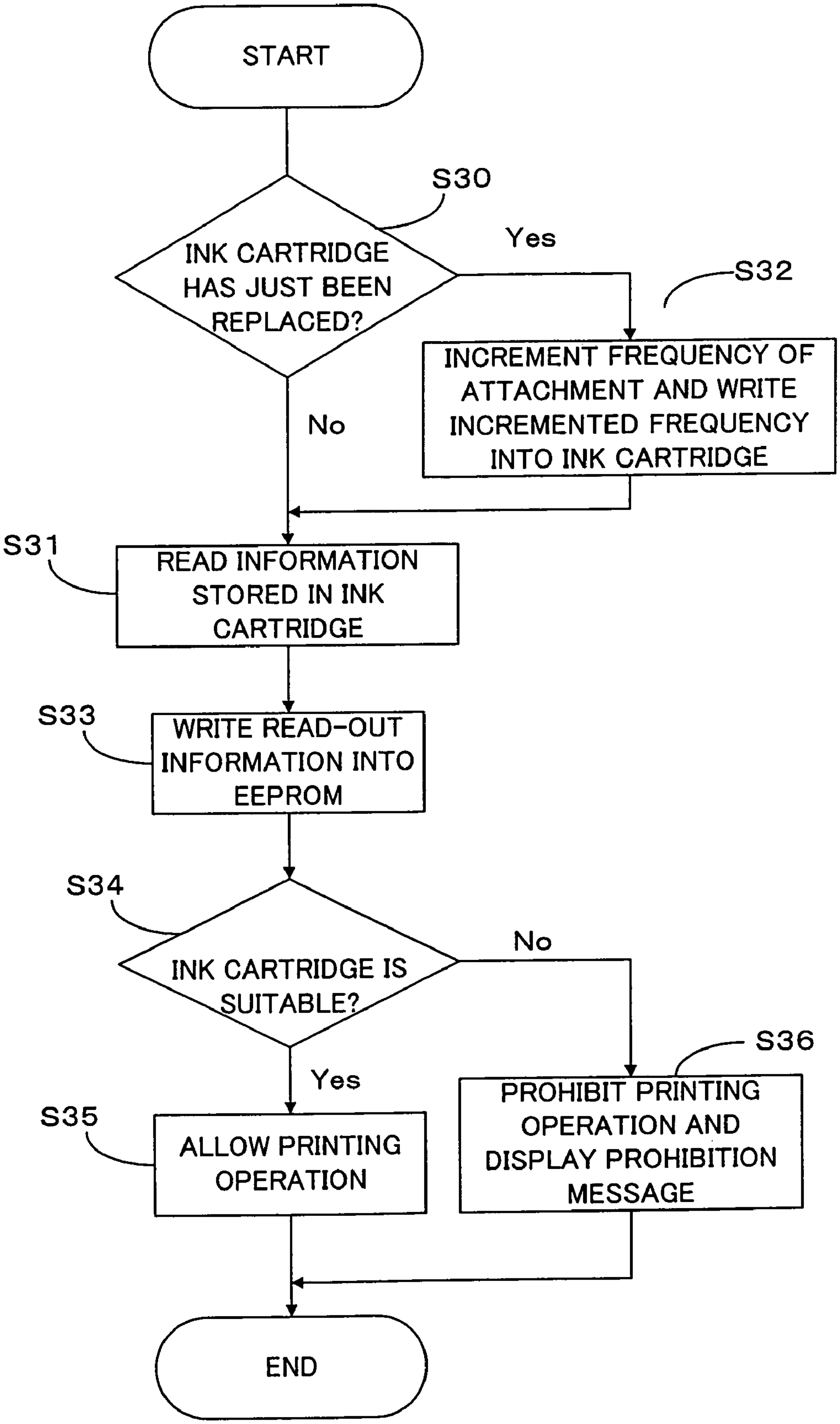
FIG. 8 is a flowchart showing a processing routine executed at a time of power supply to the ink jet printer.
Figure 9:
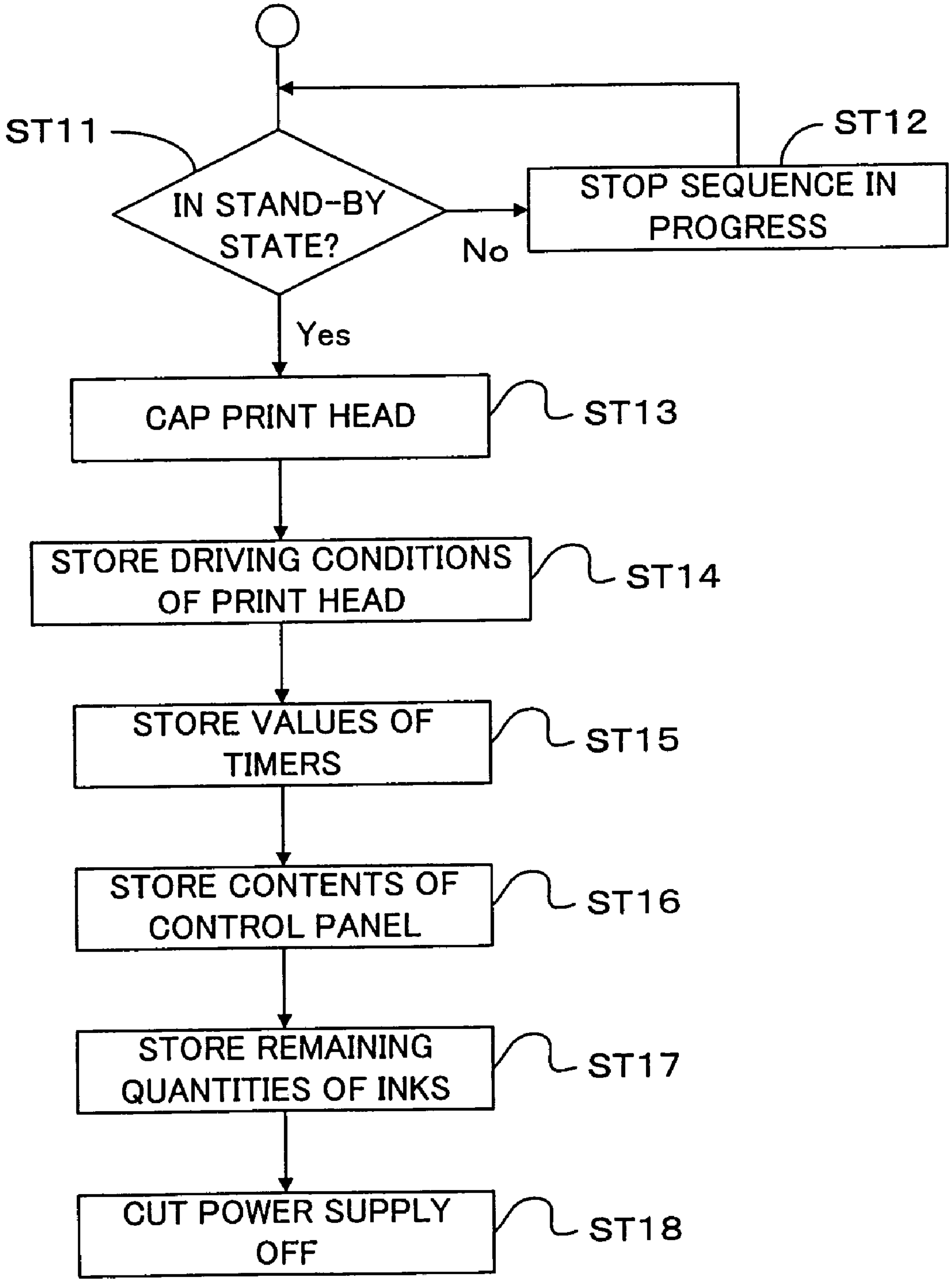
FIG. 9 is a flowchart showing a processing routine executed at a power-off time of the ink jet printer.

With reference to FIGS. 8 and 9, the following describes a series of basic processing carried out by the ink jet printer 1 of the embodiment between a power-on time and a power-off time of the printer 1. FIG. 8 is a flowchart showing a processing routine executed at a time of power supply to the ink jet printer 1. FIG. 9 is a flowchart showing a processing routine executed at a power-off time of the ink jet printer 1.

The controller 46 executes the processing routine of FIG. 8 immediately after the start of power supply. When the power source 91 of the ink jet printer 1 is turned on, the controller 46 first determines whether or not the ink cartridge 107K or 107F has just been replaced at step S30. The decision of step S30 is carried out, for example, by referring to an ink cartridge replacement flag in the case where the EEPROM 90 stores the ink cartridge replacement flag, or in another example, based on data regarding the time (hour and minute) of manufacture or production serial number data with regard to the ink cartridge 107K or 107F. In the case where the power is on without replacement of any ink cartridges 107K and 107F, that is, in the case of a negative answer at step S30, the controller 46 reads the data from the respective storage elements 80K and 80F of the ink cartridges 107K and 107F at step S31.

When it is determined that the ink cartridge 107K or 107F has just been replaced, that is, in the case of an affirmative answer at step S30, on the other hand, the controller 46 increments the frequency of attachment by one and writes the incremented frequency of attachment into the storage element 80K or 80F of the ink cartridge 107K or 107F at step S32. The controller 46 then reads the data from the respective storage elements 80K and 80F of the ink cartridges 107K and 107F at step S31. The data read out here are those required by the print controller 40 and include, for example, data regarding the year of manufacture, data regarding the month of manufacture, data regarding the validity term, and data regarding the after-unsealed validity term. The control IC 200 actually executes the reading operation from the storage elements 80K and 80F, which will be described later in detail.

The controller 46 subsequently writes the read-out data at preset addresses in the EEPROM 90 or in the RAM 44 at step S33. At subsequent step S34, the controller 46 determines whether or not the ink cartridges 107K and 107F attached to the ink jet printer 1 are suitable for the ink jet printer 1, based on the data stored in the EEPROM 90. When suitable, that is, in the case of an affirmative answer at step S34, a printing operation is allowed at step S35. This completes the preparation for printing, and the program exits from the processing routine of FIG. 8. When not suitable, that is, in the case of a negative answer at step S34, on the contrary, the printing operation is not allowed, and information representing the prohibition of printing is displayed on either the panel switch 92 or the display MT at step S36.

The ink jet printer 1 carries out a predetermined printing process in the case where the printing operation is allowed. The controller 46 calculates the remaining quantities of the respective black and color inks in the course of the predetermined printing process. The current remaining quantity of each ink is determined by subtracting an amount of ink consumption, which is due to a current printing operation, from the previous remaining quantity of ink before the start of the current printing operation. The amount of ink consumption with regard to each ink is the sum of the quantity of ink ejection and the quantity of ink suction consumed by the sucking action described previously. The quantity of ink ejection is calculated, for example, by multiplying the weight of an ink droplet by the frequency of ejection of the ink droplets. The controller 46 writes the calculated latest remaining quantities of the respective inks as the data on the remaining quantities of inks into the EEPROM 90.

The updated remaining quantities of inks are written into the respective storage elements 80K and 80F of the ink cartridges 107K and 107F after the power switch is turned off on the panel switch 92 in the ink jet printer 1.

Referring to the flowchart of FIG. 9, in response to an off-operation of the power switch on the panel switch 92 in the ink jet printer 1, the program first determines whether or not the ink jet printer 1 is in a stand-by state at step ST11. In the case where the ink jet printer 1 is not in the stand-by state at step ST11, the program stops the sequence in progress at step ST12 and returns to step ST11. In the case where the ink jet printer 1 is in the stand-by state at step ST11, on the other hand, the program drives the capping unit 108 to cap the print head 10 at step ST13, and stores the driving conditions of the print head 10 into the EEPROM 90 at step ST14. The driving conditions here include a voltage of the driving signal to compensate for the individual difference of the print head and a condition of correction to compensate for the difference between the respective colors. The program subsequently stores counts on a variety of timers into the EEPROM 90 at step ST15, and stores the contents of a control panel, for example, an adjustment value to correct the misalignment of hitting positions in the case of bi-directional printing, into the EEPROM 90 at step ST16. The program then stores the remaining quantities of the respective black and color inks, which are written in the EEPROM 90, into the respective storage elements 80K and 80F of the black and color ink cartridges 107K and 107F at step ST17. After that, the program cuts the power supply off at step ST18.

(Structure of Storage Elements 80K and 80F)

Figure 10:
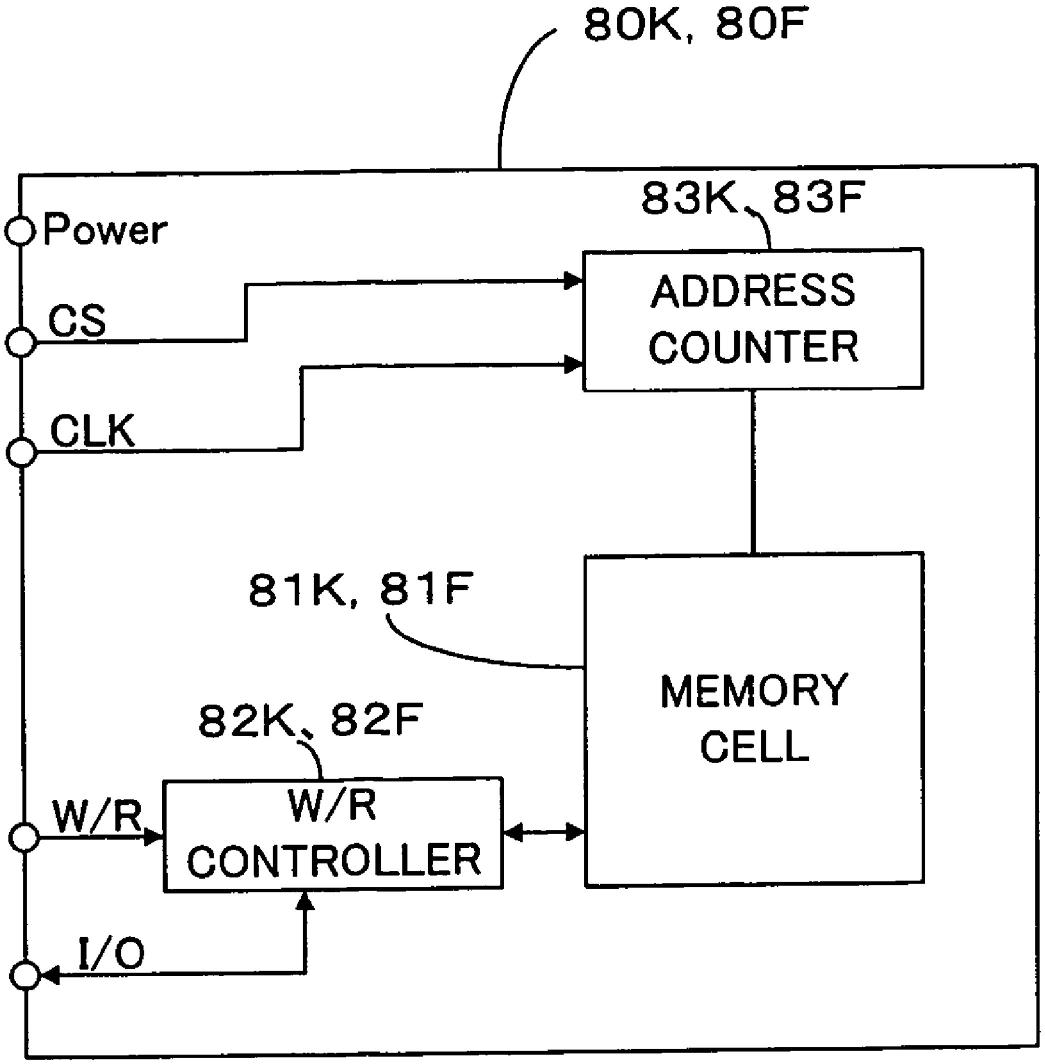
FIG. 10 is a block diagram illustrating the internal structure of the storage elements shown in FIG. 3.

The internal structure of the storage elements 80K and 80F used in the embodiment is described in detail with reference to FIGS. 10 through 12. FIG. 10 is a block diagram illustrating the internal structure of the storage elements 80K and 80F shown in FIG. 3. FIG. 11 shows the internal data structure (memory map) of the storage element 80K included in the black ink cartridge 107K. FIG. 12 shows the internal data structure (memory map) of the storage element 80F included in the color ink cartridge 107F.

The black ink cartridge 107K and the color ink cartridge 107F have cavities formed therein to function as the ink chambers and keep black and color inks, and include the storage elements 80K and 80F, respectively. In this embodiment, EEPROMs are applied for the storage elements 80K and 80F. The EEPROMs used for the storage elements 80K and 80F respectively include the memory cells 81K and 81F, read/write controllers 82K and 82F that control reading and writing operations of data from and into the memory cells 81K and 81F, and address counters 83K and 83F that count up on the occasions of the reading and writing operations of data between the printer main body 100 and the memory cells 81K and 81F via the read/write controllers 82K and 82F in response to a clock signal CLK, as shown in the block diagram of FIG. 10. The addresses in the storage elements 80K and 80F are specified by the bit unit. In the specification hereof, the addresses in the storage elements 80K and 80F represent the head addresses or the head bits, in which the corresponding pieces of information are to be stored.

The data structure of the storage element 80K included in the black ink cartridge 107K is described in detail with reference to FIG. 11. The storage element 80K has addresses 00 through 18 for readable and writable storage and addresses 28 through 66 for read only storage. In this embodiment, a piece of information on the remaining quantity of black ink is registered at the address 00 in the storage element 80K having a data length of 8 bits. A piece of information on the frequency of cleaning the print head 10 and a piece of information on the frequency of attachment of the black ink cartridge 107K are registered respectively at the addresses 08 and 10, both having a data length of 8 bits. A piece of information on a total time period of attachment of the ink cartridge 107K is registered at the address 18 having a data length of 16 bits. The data regarding the remaining quantity of black ink is allocated to the head address 00 among the readable and writable addresses 00 through 18. This arrangement enables the data regarding the remaining quantity of black ink to be written preferentially.

Among the various pieces of information relating to the manufacture of the black ink cartridge 107K, a piece of information on the year of manufacture is registered at the address 28 having a data length of 7 bits, a piece of information on the month of manufacture is registered at the address 2F having a data length of 4 bits, and a piece of information on the date of manufacture is registered at the address 33 having a data length of 5 bits. A piece of information on the time (hour) of manufacture is registered at the address 38 having a data length of 5 bits, a piece of information on the time (minute) of manufacture is registered at the address 3D having a data length of 6 bits, and a piece of information on the production serial number is registered at the address 43 having a data length of 8 bits. A piece of information on the frequency of recycle, a piece of information on the validity term of ink, and a piece of information on the after-unsealed validity term are respectively registered at the address 4B having a data length of 3 bits, at the address 60 having a data length of 6 bits, and at the address 66 having a data length of 5 bits.

The data structure of the storage element 80F included in the color ink cartridge 107F is described in detail with reference to FIG. 12. The storage element 80F has addresses 00 through 38 for readable and writable storage and addresses 48 through 86 for read only storage. Pieces of information on the remaining quantities of cyan ink, magenta ink, yellow ink, light cyan ink, and light magenta ink are registered at the addresses 00, 08, 10, 18, and 20 in the storage element 80F, each having a data length of 8 bits.

A piece of information on the frequency of cleaning the print head 10 and a piece of information on the frequency of attachment of the color ink cartridge 107F are registered respectively at the addresses 28 and 30, both having a data length of 8 bits. A piece of information on a total time period of attachment of the ink cartridge 107F is registered at the address 38 having a data length of 16 bits. The data regarding the remaining quantities of the respective color inks are allocated to the head addresses 00 through 20 among the readable and writable addresses 00 through 38. This arrangement enables the data regarding the remaining quantities of the respective color inks to be written preferentially. The pieces of information regarding the remaining quantities of cyan, magenta, and yellow inks are allocated to the first 3 bytes (24 bits), and the pieces of information regarding the remaining quantities of light cyan and light magenta inks are allocated to the following 2 bytes (16 bits). This data structure is thus applicable to a color ink cartridge having only three colors, cyan, magenta, and yellow.

Among the various pieces of information relating to the manufacture of the color ink cartridge 107F, a piece of information on the year of manufacture is registered at the address 48 having a data length of 7 bits, a piece of information on the month of manufacture is registered at the address 4F having a data length of 4 bits, and a piece of information on the date of manufacture is registered at the address 53 having a data length of 5 bits. A piece of information on the time (hour) of manufacture is registered at the address 58 having a data length of 5 bits, a piece of information on the time (minute) of manufacture is registered at the address 5D having a data length of 6 bits, and a piece of information on the production serial number is registered at the address 63 having a data length of 8 bits. A piece of information on the frequency of recycle, a piece of information on the validity term of inks, and a piece of information on the after-unsealed validity term are respectively registered at the address 6B having a data length of 3 bits, at the address 80 having a data length of 6 bits, and at the address 86 having a data length of 5 bits.

(Reading Operation from Storage Elements 80K and 80F)

Figure 13:
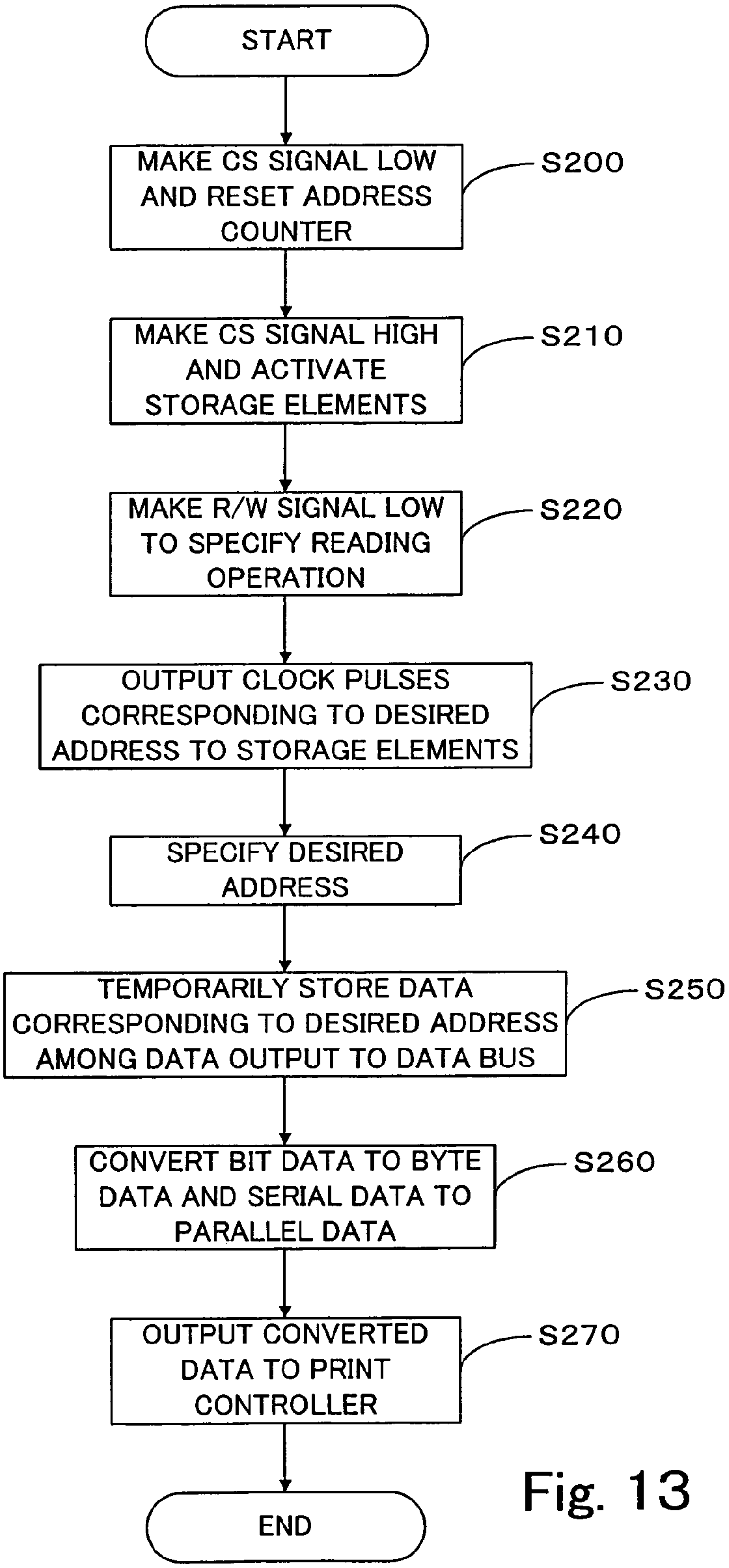
FIG. 13 is a flowchart showing a processing routine executed by the control IC in the course of the reading process from the storage elements.
Figure 14:
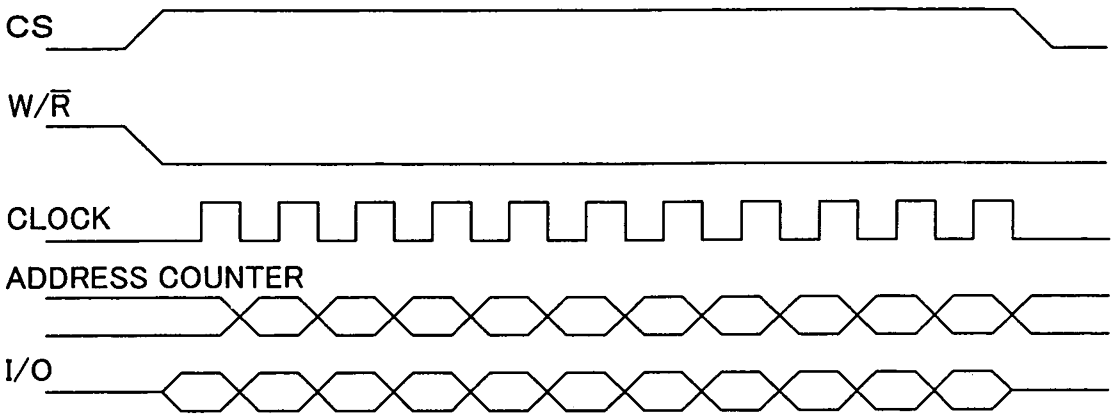
FIG. 14 is a timing chart on the occasion of the reading process shown in the flowchart of FIG. 13.

The following describes a decoding process carried out in the course of the reading operation from the storage elements 80K and 80F, which is performed by the control IC 200 in response to an instruction from the printer main body 100 (the print controller 40), with reference to FIGS. 13 and 14. FIG. 13 is a flowchart showing a processing routine executed by the control IC 200 in the course of the reading process from the storage elements 80K and 80F, and FIG. 14 is a timing chart on the occasion of the reading process shown in the flowchart of FIG. 13.

When the program enters the processing routine of FIG. 14, the control IC 200 first makes a CS signal in a low level and resets the address counters 83K and 83F in the storage elements 80K and 80F at step S200. The control IC 200 then makes the CS signal in a high level and sets the storage elements 80K and 80F in the active state at step S210. The control IC 200 subsequently makes a R/W signal in a low level and thereby specifies a reading operation from the storage elements 80K and 80F at step S220. The control IC 200 then outputs a specific number of clock pulses to the storage elements 80K and 80F at step S230. The specific number of clock pulses corresponds to a desired address, which is output from the print controller 40 and at which the print controller 40 requires to gain an access for reading data. In this address conversion process, the control IC 200 converts a first address *Adf and an end address *Ade in a desired range of addresses (bit data) in the memory cells 81K and 81F, at which the controller 46 requires to gain an access for the reading operation, into the corresponding numbers of clock pulses. The control IC 200 successively outputs (*Adf-1) clock pulses and (*Ade-*Adf) clock pulses to the storage elements 80K and 80F.

The address counters 83K and 83F in the storage elements 80K and 80F increment the address by the bit unit at a timing of a fall of the clock signal CLK. The control IC 200 thereby specifies a desired address at step S240. The data stored in the storage elements 80K and 80F are output to a data bus at the timings of the fall of the clock pulse. The control IC 200 controls the desired count on the address counter required for the reading operation in the above manner, and temporarily stores the output data corresponding to the desired address, for example, the data on the year of manufacture, the data on the month of manufacture, the data on the validity term, and the data on the after-unsealed validity term, at step S250.

The read-out data are serial data expressed by the bit unit, so that the control IC 200 converts the bit data to the byte data, as well as the serial data to the parallel data at step S260. The control IC 200 then outputs the converted parallel byte data to the print controller 40 at step S270. This completes the decoding process and the program exits from the processing routine of FIG. 14. As described previously, the address is specified and incremented by the bit unit in this embodiment.

(Normality Decision of Storage Elements 80K and 80F)

Figure 15:
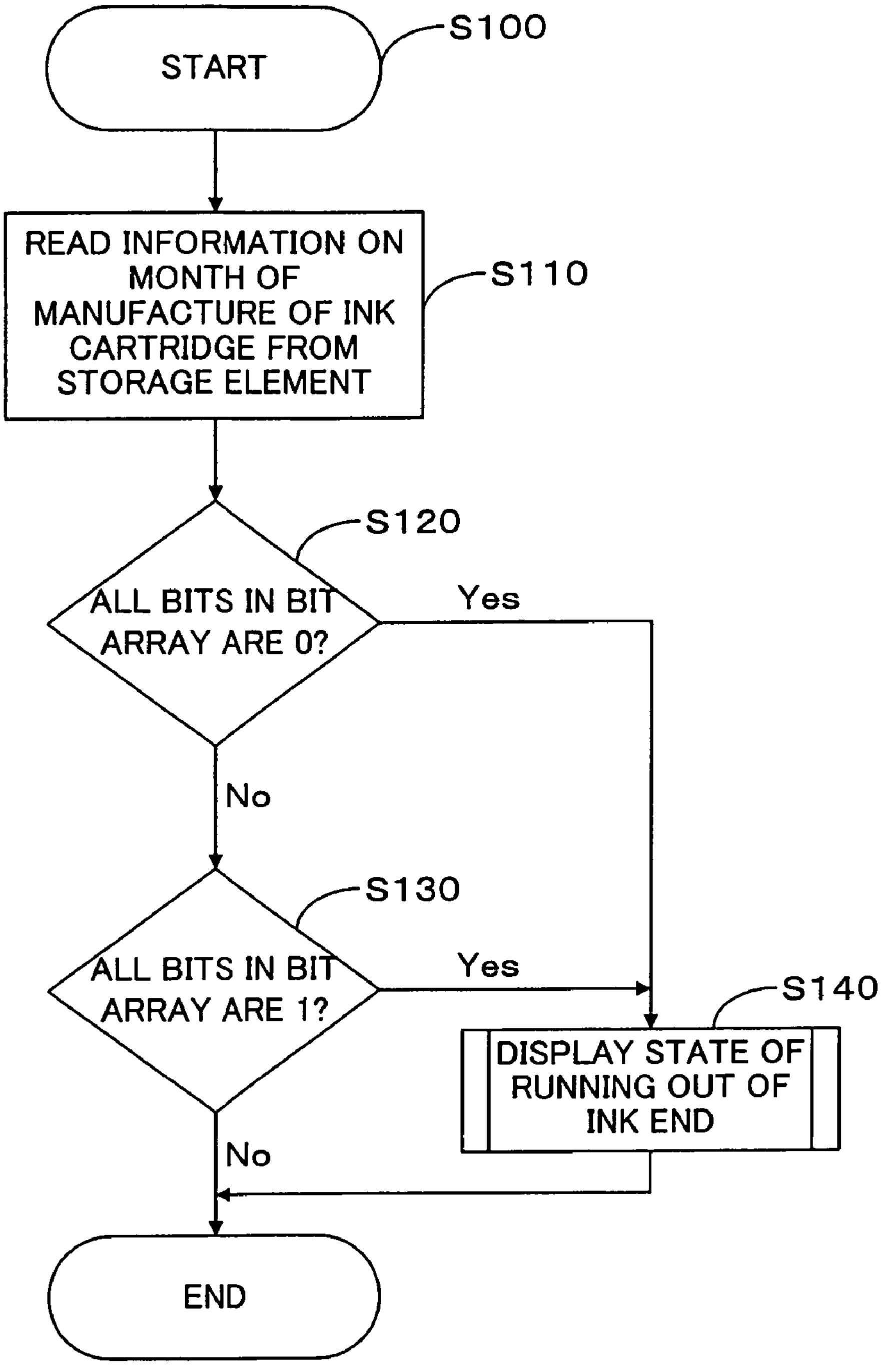
FIG. 15 is a flowchart showing a processing routine executed to identify the month of manufacture of the ink cartridge.

A process of identifying the month of manufacture of the ink cartridge carried out in this embodiment is described with reference to FIG. 15. FIG. 15 is a flowchart showing a processing routine to identify the month of manufacture of the ink cartridge. The term 'ink cartridge' in the description below represents both the black ink cartridge 107K and the color ink cartridge 107F, and the term 'storage element' therefor represents both the storage element 80K and the storage element 80F.

After the power source 91 of the printer main body 100 is turned on or after the ink cartridge is replaced with a new one, the program carries out the reading process from the storage elements 80K and 80F shown in the flowchart of FIG. 13 and subsequently executes the processing routine of FIG. 15. The program enters the processing routine at step S100, and reads a piece of information on the month of manufacture of the ink cartridge from the storage element incorporated in the ink cartridge at step S110. The program then determines whether or not all the bits in a bit data array having a data length of 4 bits and representing the month of manufacture of the ink cartridge are equal to zero at step S120. In the case where all the bits in the bit data array are not equal to zero, that is, in the case of a negative answer at step S120, the program subsequently determines whether or not all the bits in the bit data array representing the month of manufacture of the ink cartridge are equal to one at step S130. In the case where all the bits in the bit data array are not equal to one, that is, in the case of a negative answer at step S130, the program exits from this routine without any further processing. Either in the case where all the bits in the bit data array are equal to zero, that is, in the case of an affirmative answer at step S120, or in the case where all the bits in the bit data array are equal to one, that is, in the case of an affirmative answer at step S130, the program goes to step S140 to display a state of running out of ink with regard to the ink cartridge before exiting from this routine.

The process of displaying the state of running out of ink at step S140 lights up the corresponding LED on the panel switch 92 shown in FIG. 2, that is, either the black ink end LED 900 or the color ink end LED 910, so as to draw the attention of the user. The printing operation is then discontinued in the ink jet printer 1.

(Effects of First Embodiment)

As described above, the technique of the embodiment determines whether or not the storage elements 80K and 80F function normally, based on the data on the month of manufacture, which is selected among various pieces of information on the ink cartridges 107K and 107F stored in the memory cells 81K and 81F of the respective storage elements 80K and 80F. The data on the month of manufacture takes a value only in a range of 1 to 12, which corresponds to a bit data array in a range of 0001 through 1100. This system requires a relatively short bit length for the normality decision of the storage elements 80K and 80F. In the event that the storage data in the storage element 80K or 80F are destroyed, for example, due to the static electricity, the bit data array generally takes the value of either '0000' or '1111'. Namely it can be determined that the data structure of the storage element 80K or 80F is destroyed in the case where the bit data array of the data representing the month of manufacture is equal to either '0000' or '1111'. The arrangement of the embodiment thus enables the abnormality of the storage elements 80K and 80F to be detected readily and adequately.

In the above embodiment, the EEPROM is applied for the storage elements 80K and 80F. A dielectric memory of the sequential access type FEROM may be used instead of the EEPROM. The EEPROM includes flash memories.

In the above embodiment, the remaining quantities of inks are used as the information relating to the quantities of inks. The amounts of ink consumption may, however, be used instead of the remaining quantities of inks.

The principle of the present invention is applicable to the off-carriage type printer, in which the ink cartridges are not mounted on the carriage, as well as to the on-carriage type printer, in which the ink cartridges are mounted on the carriage as described in the above embodiment.

Figure 16:
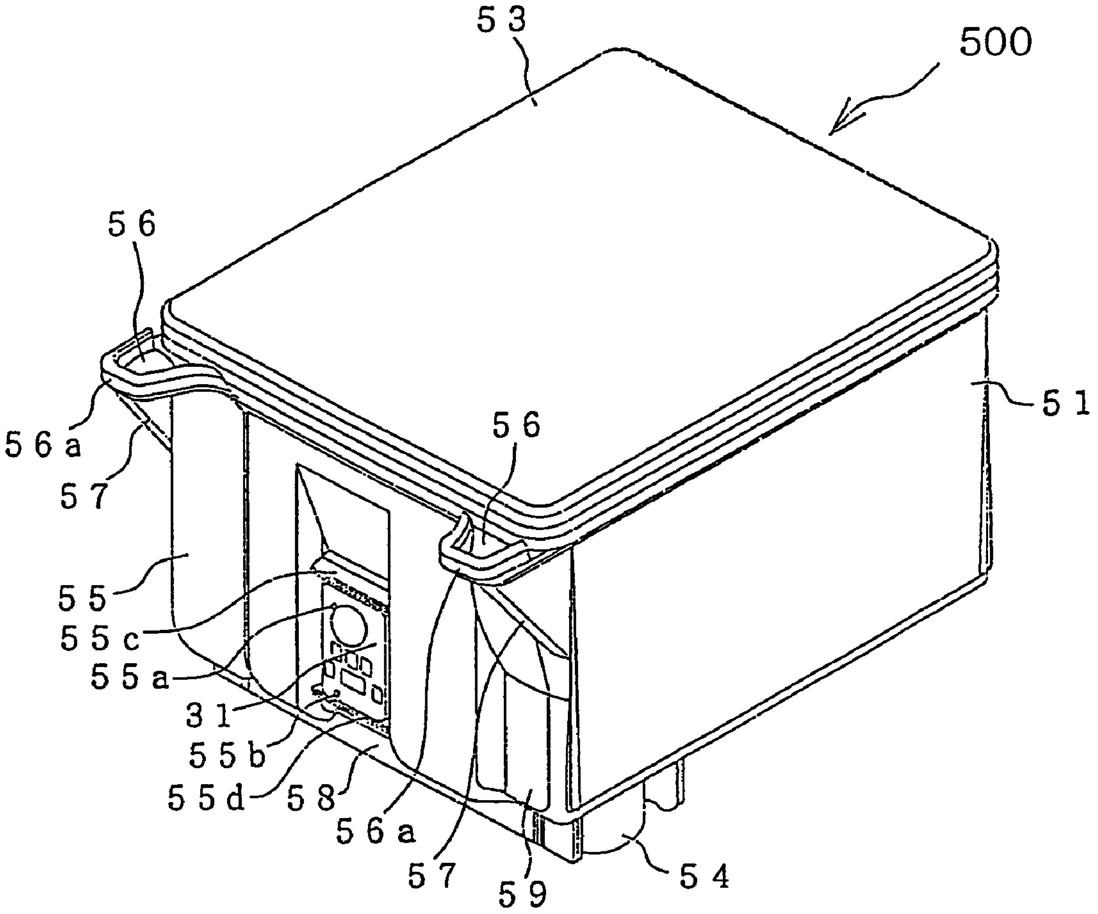
FIG. 16 is a perspective view illustrating the appearance of another ink cartridge as one modification of the present invention.

The ink cartridges 107K and 107F used in the above embodiment may be replaced with another ink cartridge 500 shown in FIG. 16. FIG. 16 is a perspective view illustrating the appearance of the ink cartridge 500 as one modification of the present invention.

The ink cartridge 500 includes a vessel 51 substantially formed in the shape of a rectangular parallelepiped, a porous body (not shown) that is impregnated with ink and accommodated in the vessel 51, and a cover member 53 that covers the top opening of the vessel 51. The vessel 51 is parted into five ink chambers (like the ink chambers 107C, 107LC, 107M, 107LM, and 107Y in the ink cartridge 107F discussed in the above embodiment), which separately keep five different color inks. Ink supply inlets 54 for the respective color inks are formed at specific positions on the bottom face of the vessel 51. The ink supply inlets 54 at the specific positions face ink supply needles (not shown here) when the ink cartridge 500 is attached to a cartridge attachment unit of a printer main body (not shown here). A pair of extensions 56 are integrally formed with the upper end of an upright wall 55, which is located on the side of the ink supply inlets 54. The extensions 56 receive projections of a lever (not shown here) fixed to the printer main body. The extensions 56 are located on both side ends of the upright wall 55 and respectively have ribs 56*a*. A triangular rib 57 is also formed between the lower face of each extension 56 and the upright wall 55. The vessel

51 also has a check recess 59, which prevents the ink cartridge 500 from being attached to the unsuitable cartridge attachment unit mistakenly.

The upright wall 55 also has a recess 58 that is located on the substantial center of the width of the ink cartridge 500. A circuit board 31 is mounted on the recess 58. The circuit board 31 has a plurality of contacts, which are located to face contacts on the printer main body, and a storage element (not shown) mounted on the rear face thereof. The upright wall 55 is further provided with projections 55*a* and 55*b* and extensions 55*c* and 55*d* for positioning the circuit board 31.

Like the embodiment discussed above, in the ink cartridge 500 of this modified structure, required data, for example, data on the remaining quantities of inks, are stored into the storage element mounted on the circuit board 31.

In the above embodiment, the five color inks, that is, magenta, cyan, yellow, light cyan, and light magenta, are applied for the plurality of different color inks. The present invention is also applicable to any combination of an arbitrary number of color inks, for example, a combination of three color inks of magenta, cyan and yellow, a combination of six different color inks or seven different color inks including other than above five color inks.

The present invention is not restricted to the above embodiment or its modifications, but there may be many other modifications, changes, and alterations without departing from the scope or spirit of the main characteristics of the present invention.

The scope and spirit of the present invention are limited only by the terms of the appended claims.

What is claimed is:

1. A printer, to which an ink cartridge having a storage unit is detachably attached, the printer comprising:

a reading unit reading a piece of ink related information indicating a month of manufacture of the ink cartridge, wherein the piece of information has been registered in advance in a predetermined format, from the storage unit; and a decision unit identifying whether the read-out piece of ink related information satisfies the predetermined format, so as to determine whether the storage unit is normal or whether the storage unit is not normal if the read-out piece of ink related information has been destroyed, wherein the predetermined format is four-bit data, and the decision unit determines that the storage unit is not normal when the ink-related information has a predetermined value.

2. A printer according to claim 1, wherein the predetermined value is one of 0000 and 1111.

3. A method of determining whether a storage unit included in an ink cartridge is normal, wherein the ink cartridge is configured to be detachably attached to a printer, the method comprising the steps of:

(a) reading a piece of ink related information indicating a month of manufacture of the ink cartridge that has been registered in advance in a predetermined format, from the storage unit; and (b) identifying whether the read-out piece of ink related information satisfies the predetermined format, so as to determine whether the storage unit is normal or whether the storage unit is not normal if the read-out piece of ink related information has been destroyed, wherein the predetermined format is four-bit data, and the identifying step determines that the storage unit is not normal when the ink-related information has a predetermined value.

4. A method according to claim 3, wherein the predetermined value is one of 0000 and 1111.

5. A computer readable recording medium, on which a specific computer program is recorded, the specific computer program being used to determine whether a storage unit is normal, wherein the storage unit is included in an ink cartridge that is detachably attached to a printer, the specific computer program comprising:

a program code that causes a computer to read a piece of ink related information indicating a month of manufacture of the ink cartridge, wherein the piece of ink related information has been registered in advance in a predetermined format, from the storage unit;

a program code that causes the computer to identify whether the read-out piece of ink related information satisfies the predetermined format; and a program code that causes the computer to determine that the storage unit is not normal in the case where the read-out piece of ink related information does not satisfy the predetermined format if the read-out piece of ink related information has been destroyed, wherein the predetermined format is four-bit data, and the computer code causes the computer to determine that the storage unit is not normal when the ink-related information has a predetermined value.

6. A computer readable recording medium according to claim 5, wherein the predetermined value is one of 0000 and 1111.

7. A method of determining whether a readable and writable storage unit is normal, wherein the readable and writable storage unit is included in an ink cartridge that is detachably attached to a printer, the method comprising the steps of:

reading a piece of ink related information indicating a month of manufacture of the ink cartridge from the storage unit; and determining whether the storage unit is normal, based on the read-out piece of ink related information, or whether the storage unit is not normal if the read-out piece of ink related information has been destroyed, wherein the ink-related information is four-bit data, and the determining step determines that the storage unit is not normal when the ink-related information has a predetermined value.

8. A method according to claim 7, wherein the predetermined value is one of 0000 and 1111.

* * * * *